(12) United States Patent
Jung

(10) Patent No.: US 6,475,872 B1
(45) Date of Patent: Nov. 5, 2002

(54) POLYSILICON THIN FILM TRANSISTOR AND METHOD OF MANUFACTURING THE SAME

(75) Inventor: Yun Ho Jung, Seoul (KR)

(73) Assignee: LG. Philips LCD Co., Ltd., Seoul (KR)

(*) Notice: Subject to any disclaimer, the term of this patent is extended or adjusted under 35 U.S.C. 154(b) by 0 days.

(21) Appl. No.: 09/573,350

(22) Filed: May 19, 2000

(30) Foreign Application Priority Data

May 20, 1999 (KR) .......................................... 99-18275

(51) Int. Cl.[7] .............................................. H01L 21/20
(52) U.S. Cl. ...................... 438/384; 438/149; 438/795; 438/486
(58) Field of Search ................................ 438/149, 150, 438/151, 153, 486, 308, 795

(56) References Cited

U.S. PATENT DOCUMENTS

| | | | | |
|---|---|---|---|---|
| 5,807,770 A | * | 9/1998 | Mineji | 438/151 |
| 6,159,777 A | * | 12/2000 | Takenouchi et al. | 438/149 |
| 6,210,996 B1 | * | 4/2001 | Yamazaki et al. | 438/150 |
| 6,274,888 B1 | * | 8/2001 | Suzuki et al. | 257/72 |
| 6,322,625 B2 | * | 11/2001 | Im | 117/43 |
| 6,323,515 B1 | * | 11/2001 | Yamazaki et al. | 257/316 |
| 6,340,830 B1 | * | 1/2002 | Takemura | 257/350 |
| 6,368,945 B1 | * | 4/2002 | Im | 438/487 |

FOREIGN PATENT DOCUMENTS

| JP | 3161977 | 7/1991 | |
|---|---|---|---|
| WO | 97/45827 | 12/1997 | |
| WO | WO 0171791 A1 | * 9/2001 | |

OTHER PUBLICATIONS

Sposili et al., Single Crystal Si Films via a low–substrate––temperature Excimer–Laser Crystallization Method, 1997, Mat. Res. Soc. Symp. Pro. vol. 452, pp. 953–958.*

James S. IM et al., Appl. Phys. Lett. 70 (25), p. 3434–6 (1997).

J.P. Leonard et al., Mat. Res. Soc. Symp. Proc., vol. 452, pp. 947–952 (1997).

Fujio Okumura et al., Dynamic Leakage Current Reduction Poly–Si TFTs for AMLCDs, pp. 24–27, Functional Devices Research Lab., NEC Corp.

* cited by examiner

*Primary Examiner*—Caridad Everhart
*Assistant Examiner*—Chuong A Luu
(74) *Attorney, Agent, or Firm*—Birch, Stewart, Kolasch & Birch, LLP

(57) ABSTRACT

The present invention discloses a method of manufacturing a thin film transistor for use in a liquid crystal display device in which includes crystallizing an amorphous silicon layer formed over a substrate using a first SLS (sequential lateral solidification) laser annealing technique to form a polysilicon layer; forming sequentially a gate insulating layer and a gate electrode on the polysilicon layer; ion-doping the polysilicon layer using the gate electrode as a mask to form source and drain regions; and activating the gate electrode and the source and drain regions using a second SLS laser annealing technique. The gate electrode comprises an amorphous silicon.

20 Claims, 3 Drawing Sheets

POLYSILICON THIN FILM TRANSISTOR AND METHOD OF MANUFACTURING THE SAME

CROSS REFERENCE

This application claims the benefit of Korean Patent Application No. 1999-18275, filed on May 20, 1999, under 35 U.S.C. §119, the entirety of which is hereby incorporated by reference.

BACKGROUND OF THE INVENTION

1. Field of the Invention

The present invention relates to a thin film transistor (TFT), and more particularly, to a polysilicon thin film transistor (Poly-Si TFT) and a method of manufacturing the same.

2. Description of Related Art

Conventional polysilicon thin film transistors (hereinafter referred to simply as "Poly-Si TFTs") are commonly employed in high-density static random access memory cells (SRAMs) for load pull-up devices, as well as used both as switching elements and as peripheral driver circuitry in large-area active-matrix liquid crystal displays (LCDs).

FIGS. 1A to 1D are cross-sectional views illustrating the process of manufacturing a typical Poly-Si TFT of a coplanar type for use in a liquid crystal display device. As shown in FIG. 1A, a buffer layer 20 of SiNx or SiOx is formed on a transparent substrate 10, and an amorphous silicon layer of a thickness of 1500 Å is deposited on the buffer layer 20. The amorphous silicon layer 20 undergoes the crystallization process so that a polysilicon layer 30 is formed.

As shown in FIG. 1B, a gate insulating layer 40 comprising an inorganic insulating material such as SiNx and SiOx, or an organic insulating material such as BCB (benzocyclobutene), and a gate electrode 50 comprising a metal such as Mo, Cr, Al, and Ti are sequentially formed on the polysilicon layer 30. Then, the substrate 10 having the gate insulating layer 40 and the gate electrode 50 is ion-doped with an n-type impurity or a p-type impurity using the gate electrode 50 as a mask to define source and drain regions 30b and 30c which are amorphous semiconductor portions.

As shown in FIG. 1C, the source and drain regions 30b and 30c undergo the activation process to active the impurity ion gases using a laser annealing technique or a furnace annealing technique. Sequentially, as shown in FIG. 1D, a passivation film 60 comprising an inorganic insulating material, for example, SiNx or SiOx, is formed over the entire substrate 10 while covering the gate electrode 50. Contact holes 32 and 34 are formed, exposing the source and drain regions 30b and 30c. Source and drain electrodes 70 and 80 comprising a metal such as Mo and Cr are formed to contact the source and drain regions 30b and 30c through the contact holes 32 and 34.

However, the coplanar type Poly-Si TFT having the above-mentioned structure has a problem of degraded electric characteristics during the activation process. First, the conventional process fails to uniformly and densely grow grains crystallized during the activation process of the source and drain regions 30b and 30c. In other words, in case of the conventional laser annealing technique, the crystallization and activation processes are performed using a laser beam less in energy density than that sufficient to completely melt the amorphous silicon layer, producing grains whose size is thousands of Å to 1 $\mu$m. Thus, defects between grain boundaries degrade the electric characteristics of the TFT.

Secondly, since the gate electrode 50 is made of a metal layer and a temperature of a laser beam during crystallization or activation of the amorphous silicon layer is greater than a melting temperature of the metal layer, a laser beam of a high temperature during crystallization and activation may cause the gate electrode to be molten. Also, if the temperature of a laser beam is set to be lower than the melting temperature of the gate electrode to prevent the gate electrode from being damaged, the crystallization process is not effectively performed, thereby forming incomplete polysilicon layer having amorphous portions.

To overcome these problems, Japanese Patent Publication of Application No. 3-161977 discloses a Poly-Si TFT having a gate electrode comprising an amorphous silicon. According to the above-mentioned patent publication, as shown in FIG. 2, the method of manufacturing the prior art TFT comprises the steps of: forming a buffer layer 120 on a substrate 110; forming a semiconductor layer 130 having a polysilicon layer 130a and source and drain regions 130b and 130c; forming a gate insulating layer 140 and a gate electrode 150 of an amorphous silicon; crystallizing the gate electrode 150; activating the source and drain regions 130b and 130c using a laser annealing technique after ion-doping process; and forming a passivation film 160, source and drain electrodes 170 and 180.

The prior art TFT described above can have uniform-sized grains being activated using a laser beam having a temperature higher than the melting temperature of a metal. However, in spite of such advantages, in case of using a conventional laser annealing technique or a furnace annealing technique for activation, this process still fails to uniformly and densely grow grains crystallized during the activation process of the source and drain regions 30b and 30c, thereby deteriorating the electric characteristics of the TFT.

SUMMARY OF THE INVENTION

An object of the present invention is to provide a polysilicon thin film transistor that has good electric characteristics and a low-resistant gate electrode.

In order to achieve the above and other objects, the present invention is directed to a method of manufacturing a thin film transistor for use in a liquid crystal display device, comprising: crystallizing an amorphous silicon layer formed over a substrate using a first SLS (sequential lateral solidification) laser annealing technique to form a polysilicon layer; forming sequentially a gate insulating layer and a gate electrode on the polysilicon layer; ion-doping the polysilicon layer using the gate electrode as a mask to form source and drain regions; and activating the gate electrode and the source and drain regions using a second SLS laser annealing technique.

The present invention further comprises the steps of forming a passivation film on the gate electrode while covering the entire substrate; forming contact holes to expose the source and drain regions; and forming source and drain electrodes to respectively contact the source and drain regions through the contact holes.

The gate electrode comprises an amorphous silicon. A laser beam for use in the SLS laser annealing technique is less than 100 $\mu$m in width.

BRIEF DESCRIPTION OF THE DRAWINGS

For a more complete understanding of the present invention and the advantages thereof, reference is now made to the following descriptions taken in conjunction with the accompanying drawings, and in which.

DETAILED DESCRIPTION OF PREFERRED EMBODIMENTS

Reference will now be made in detail to the preferred embodiment of the present invention, example of which is illustrated in the accompanying drawings.

Figure 1A:
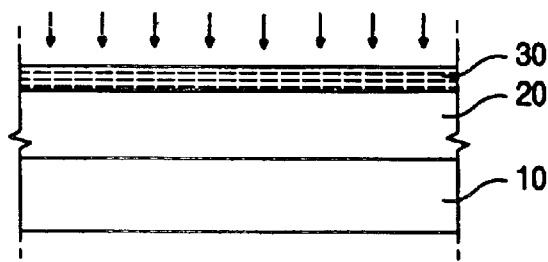
FIGS. 1A to 1D are cross-sectional views illustrating a process of manufacturing a conventional thin film transistor for use in a liquid crystal display device.
Figure 1B:
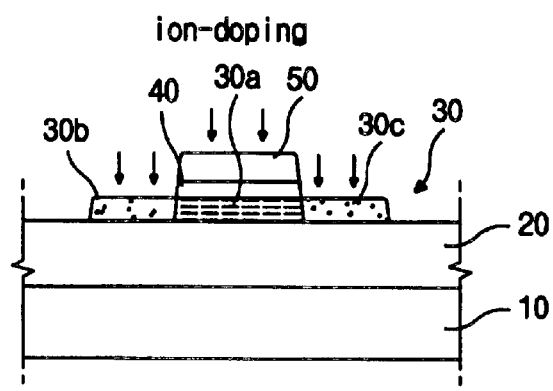
Figure 1C:
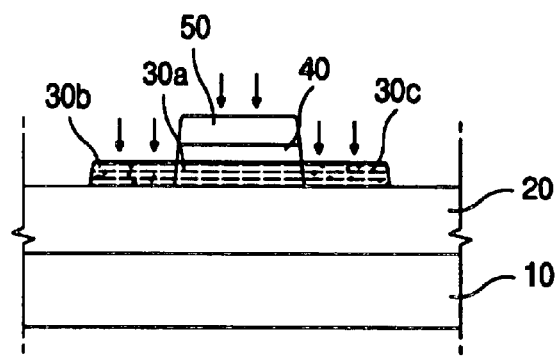
Figure 1D:
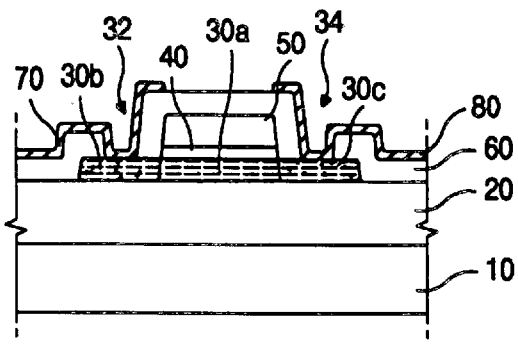
Figure 2:
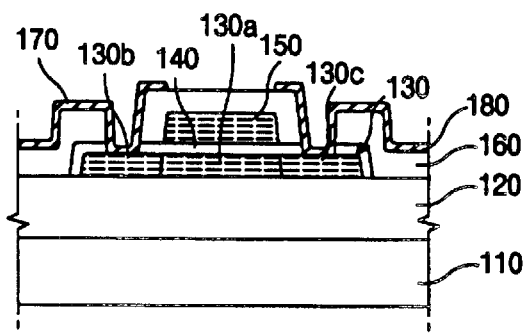
FIG. 2 is a cross-sectional view illustrating another exemplary structure of a conventional thin film transistor.
Figure 3A:
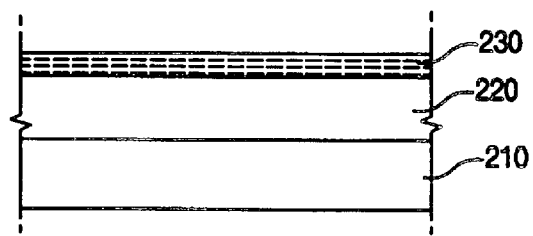
FIGS. 3A to 3D are cross-sectional views illustrating a process of manufacturing a thin film transistor for use in a liquid crystal display device according to a preferred embodiment of the present invention.

FIGS. 3A to 3D are cross-sectional views illustrating a process of manufacturing a coplanar type polysilicon thin film transistor (a coplanar type Poly-Si TFT) according to one embodiment of the present invention. As shown in FIG. 3A, a buffer layer 220 of an inorganic insulating material such SiNx and SiOx is formed on a transparent substrate 210, and an amorphous silicon layer is formed on the buffer layer 220. Using a first SLS (sequential lateral solidification) laser annealing technique, the amorphous silicon layer is crystallized to form a polysilicon layer 230 or a single crystalline silicon layer. At this time, a laser beam has an energy density capable of completely melting even a bottom portion of the amorphous silicon layer, and a width of the laser beam is preferably less than 100 $\mu$m.

The SLS process is introduced to artificially control a distribution of the grain boundaries or to satisfy a need of elements having a single crystal (Robert S. Sposilli, M. A. Crowder, and James S. Im, Mat. Res. Soc. Symp. Proc. Vol. 452, 956-957, 1997). In other words, the SLS process is a technique that uses a laser beam of high density and narrow width (e.g., around several mm) to grow grains in a direction perpendicular to the boundary between a liquid silicon region and a solid silicon region and adequately adjusts an energy density and a scanning extent of a laser beam to laterally grow grains according to a desired distance for crystallization of an amorphous silicon layer.

Figure 3B:
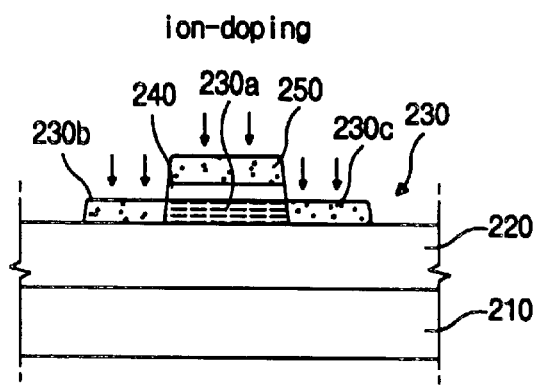
Figure 3C:
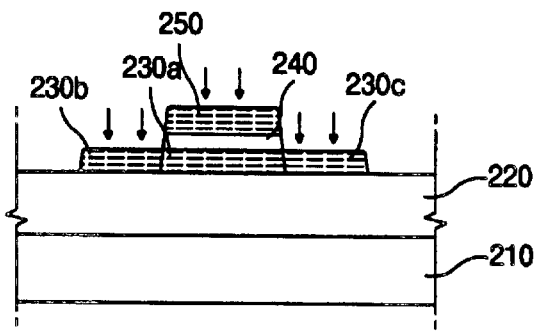

Sequentially, as shown in FIG. 3B, the polysilicon layer 230 is patterned to define a semiconductor layer having an active area 230a and source and drain electrodes 230b and 230c. Then, a gate insulating layer 240 of an inorganic insulating material such as SiNx and SiOx or an organic insulating material such BCB, and a gate electrode 250 of an amorphous silicon are sequentially formed on the active area 230a. Next, the substrate 210 having the gate insulating layer 240 and the gate electrode 250 is ion-doped with a n-type or p-type impurity using the gate electrode 250 as a mask so that the source and drain regions 230b and 230c become amorphous again, while the active area 230a remains in the polycrystalline state. As shown in FIG. 3C, the source and drain regions 230b and 230c undergo the activation process using a second SLS laser annealing technique.

At this time, in case that a portion of the semiconductor layer having the active region and the source and drain regions is different in thickness from a portion of the semiconductor layer under the gate electrode, a laser beam of an energy density enough to melt even a bottom portion of the thicker portion of these portions is scanned.

Figure 3D:
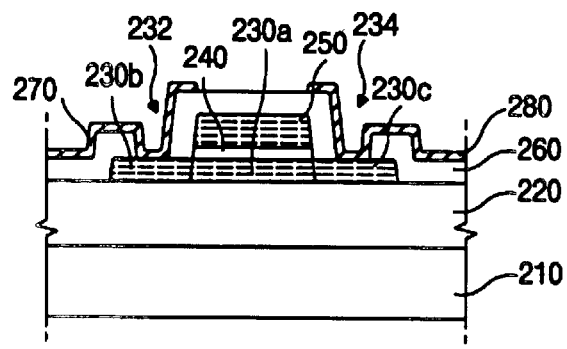

Sequentially, as shown in FIG. 3D, a passivation film 260 is formed over the entire substrate 210 while covering the gate electrode 250. Contact holes 232 and 234 are formed to expose the source and drain regions 230b and 230c, and then source and drain electrodes 270 and 280 are formed to respectively contact the source and drain regions 230b and 230c.

As described hereinbefore, using the SLS laser annealing technique, according to the preferred embodiment of the present invention, since the dense and uniform-sized grains of the polysilicon layer can be obtained and it is possible that even the bottom portion of the gate electrode of the amorphous silicon with impurity is uniformly crystallized, electric characteristics of the Poly-Si TFT can be improved and the low-resistant gate electrode can be obtained.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A method of manufacturing a thin film transistor, comprising the steps of:

crystallizing an amorphous silicon layer formed over a substrate using a first SLS (sequential lateral solidification) laser annealing technique to form a polysilicon layer;

forming sequentially a gate insulating layer and a gate electrode on the polysilicon layer;

ion-doping the polysilicon layer to form source and drain regions; and activating the gate electrode and the source and drain regions using a second SLS laser annealing technique.

2. The method of claim 1, wherein the gate electrode comprises an amorphous silicon.

3. The method of claim 2, wherein a laser beam used in at least one of the first and second SLS laser annealing techniques is less than 100 $\mu$m in width.

4. The method of claim 2, further comprising the steps of:

forming a passivation film on the gate electrode while covering the entire substrate;

forming contact holes to expose the source and drain regions; and forming source and drain electrodes to respectively contact the source and drain regions through the contact holes.

5. The method of claim 2, wherein the ion-doping step includes the step of:

doping the polysilicon layer and the gate electrode with impurities to form the source and drain regions.

6. The method of claim 2, wherein the gate insulating layer is made of one of the following materials: SiNx, SiOx, and BCB.

7. A method of manufacturing a thin film transistor, comprising the steps of:

providing a polysilicon layer on a substrate;

forming a gate electrode made of amorphous silicon on the polysilicon layer;

ion-doping the polysilicon layer and the gate electrode to define source and drain regions; and activating the gate electrode and the source and drain regions using an SLS (sequential lateral solidification) laser annealing process.

8. The method of claim 7, wherein the providing step includes the steps of:

providing an amorphous silicon layer on the substrate; and crystallizing the amorphous silicon layer using an SLS laser annealing process to provide the polysilicon layer.

9. The method of claim 7, wherein the laser beam used in the SLS laser annealing process has a width of less than 100 µm.

10. The method of claim 8, further comprising the step of:

forming a gate insulating layer between the gate electrode and the polysilicon layer.

11. The method of claim 10, further comprising the steps of:

forming a passivation layer on the gate electrode;

forming contact holes to expose the source and drain regions; and forming source and drain electrodes on the substrate that respectively contact the source and drain regions through the contact holes.

12. The method of claim 10, wherein the gate insulating layer is made of one of the following materials: SiNx, SiOx, and BCB.

13. A method of manufacturing a thin film transistor, comprising the steps of:

providing a silicon layer on a substrate;

forming a gate electrode on the silicon layer;

ion-doping the silicon layer and the gate electrode to define source and drain regions; and activating the gate electrode and the source and drain regions using an SLS (sequential lateral solidification) laser annealing process.

14. The method of claim 13, wherein, in the providing step, the silicon layer is a single crystalline silicon layer.

15. The method of claim 14, wherein the providing step includes the steps of:

providing an amorphous silicon layer on the substrate; and crystallizing the amorphous silicon layer using an SLS laser annealing process to provide the single crystalline silicon layer.

16. The method of claim 13, wherein, in the forming step, the gate electrode is made of amorphous silicon.

17. The method of claim 16, wherein, in the providing step, the silicon layer is a single crystalline silicon layer, and the providing step includes the steps of:

providing an amorphous silicon layer on the substrate; and crystallizing the amorphous silicon layer using an SLS laser annealing process to provide the single crystalline silicon layer.

18. The method of claim 13, wherein a laser beam used in the SLS laser annealing process has a width of less than 100 µm.

19. The method of claim 15, wherein a laser beam used in the SLS laser annealing process in the crystallizing step has a width of less than 100 µm.

20. The method of claim 13, further comprising the steps of:

forming a gate insulating layer between the gate electrode and the silicon layer;

forming a passivation layer on the gate electrode;

forming contact holes to expose the source and drain regions; and forming source and drain electrodes on the substrate that respectively contact the source and drain regions through the contact holes.

* * * * *